US006849912B2

(12) United States Patent
Bertz et al.

(10) Patent No.: US 6,849,912 B2
(45) Date of Patent: Feb. 1, 2005

(54) VERTICAL TRANSISTOR COMPRISING A MOBILE GATE AND A METHOD FOR THE PRODUCTION THEREOF

(75) Inventors: Andreas Bertz, Chemnitz (DE); Steffen Heinz, Burgstädt (DE); Thomas Gessner, Chemnitz (DE)

(73) Assignee: Fraunhofer-Gesellschaft zur Forderung der angewandten Forschung, e.V., Munich (DE)

( * ) Notice: Subject to any disclaimer, the term of this patent is extended or adjusted under 35 U.S.C. 154(b) by 101 days.

(21) Appl. No.: 10/311,759
(22) PCT Filed: Apr. 26, 2001
(86) PCT No.: PCT/EP01/04702
§ 371 (c)(1),
(2), (4) Date: Feb. 12, 2003
(87) PCT Pub. No.: WO01/98200
PCT Pub. Date: Dec. 27, 2001

(65) Prior Publication Data
US 2003/0173611 A1 Sep. 18, 2003

(30) Foreign Application Priority Data
Jun. 21, 2000  (DE) .......................... 100 29 501

(51) Int. Cl.$^7$ ............................................. H01L 29/82
(52) U.S. Cl. ....................... 257/417; 257/414; 257/415; 257/418; 438/48; 438/50; 438/52
(58) Field of Search ................................ 257/414, 415, 257/417, 418; 438/48, 50, 52

(56) References Cited

U.S. PATENT DOCUMENTS 5,903,038 A * 5/1999 Zhang et al. ............... 257/417

* cited by examiner

*Primary Examiner*—Long Pham
*Assistant Examiner*—Wai-Sing Louie
(74) *Attorney, Agent, or Firm*—Breiner & Breiner, L.L.C.

(57) ABSTRACT

What is proposed is a vertical field effect transistor produced from a semiconductor wafer, comprising a residual transistor composed of a source zone, a channel zone and a drain zone, as well as a movable gate structure disposed by means of at least one flexible suspension in front of said channel zone and spaced therefrom, which is characterized by the provision that the movable gate structure consists of the material of said semiconductor wafer. The suspensions of the movable structure preferably present a high ratio of their height to their width, such that the movable gate may preferably move in the wafer plane.

6 Claims, 3 Drawing Sheets

VERTICAL TRANSISTOR COMPRISING A MOBILE GATE AND A METHOD FOR THE PRODUCTION THEREOF

The present invention relates to a vertical field effect transistor manufactured from a semiconductor wafer, with a movable gate for converting signals from a mechanical into an electrical quantity, preferably for measuring mechanical movements in the wafer plane, and to a method of producing this transistor.

A substantial part of the products manufactured in the field of micro system technology is based on the detection of mechanical movements (e.g. pressure gauges, acceleration sensors, vibration sensors, positioning systems). The movements of these sensor or actuator systems are analysed mainly by means of piezo-resistive, piezoelectric or capacitive methods. The shift of the crystal lattice, the change of the resistance of a deforming layer or the change of the capacitance of a plate system is utilised for the conversion of the signals from a mechanical quantity into an electric quantity by means of appropriate structures. It is expedient here when all the mechanical components are substantially made of the same mechanically stable materials such as mono-crystalline silicon.

Prior Art

The U.S. Pat. No. 5,847,454 describes a method of capacitive analysis for measuring the movements in the wafer plane. In that case, the sidewalls must be insulated from the substrate material in particular and then coated with an additional conductive layer.

When the method of capacitive conversion is employed on the basis of silicon combs with metal-coated lateral surfaces for an application with movements in the wafer plane, the problem of a high ratio between the basic capacitance of the converter structure and the useful capacitance (up to 10,000:1), i.e. the achievable change of capacitance, is created in addition to the aforementioned difficulties with the insulation and the metal plating of the lateral walls. This is due to high stray and line capacitance levels. As a result of the small change of the capacitance, a high-impedance signal current source must be provided for signal analysis. The processing of the shifting current through the sensor capacitor requires complex low-noise converter circuits. Another problem derives moreover from the stratum voltages integrated into the additional layers. Vertical and lateral bending of the structures as well as an expedient thermal behaviour are the consequences. Apart therefrom, the general rule applies that, as a result of the functions, the purely capacitive methods involve a very high demand in terms of area.

The U.S. Pat. No. 3,413,573 discloses a so-called RGT element (resonant gate transistor) and the U.S. Pat. No. 3,585,466 describes an MGT element (movable gate transistor). These components are used to realise high-quality micro-mechanical resonators. A mobile microstructure, which has the function of a gate, is provided above the channel zone of a MOS transistor (MOSFET) of a common type. In that method, the variation of the charge, which is caused by the variation of the distance between a movable gate electrode and the channel or a second stationary floating gate electrode, is utilised. A similar effect is also employed to detect variations in position and movement. The distance of the gate electrode takes an influence on the resistance of the inversion channel between the drain and source connection zones. As a result, a proportional change of the current flow through the inversion channel occurs. Due to the control of the inversion channel through the movable gate electrode, it is not the capacitance between two plates, which is analysed, but rather the electric field towards the inversion channel. By contrast to the principle of capacitive effect (one-port network), where the shifting current between the mobile and the station<nary capacitor plates is analysed and where also the often very high basic capacitance produces its effects between the input and the output in parallel with the useful capacitance, the field effect transistor with a movable gate electrode rather constitutes a "transconductance" component (dual-port network). Here, the modulated current flows in the output network in the stationary "plate", i.e. in the residual transistor consisting of the source, drain and bulk zones. In the input network, i.e. in the movable gate, the output network is controlled via the electric field between the gate and the inversion channel. This corresponds to a converter structure that presents a substantially less strong dependence on the stray and line capacitance levels. This converter structure is, at the same time, the first amplifier element in the signal processing chain. Due to the direct control of the inversion channel and the resulting low-impedance signal output, it is possible to operate the converter element as signal voltage source, e.g. as source follower. According to the U.S. Pat. No. 4,767,973, U.S. Pat. No. 4,772,928 and U.S. Pat. No. 6,043,524, the movement of tongue structures in a direction orthogonal on the wafer plane is detected in this manner. The U.S. Pat. No. 4,772,928 discloses the structure of a sensor that requires processing such as a lithographic process or ion implantation, for the manufacture of both wafer sides. A lithographic process from the rear side (e.g. in pits), specifically in the case of a break-through wafer, constitutes a complex and expensive manufacturing method. Due to the structure of the sensor, the movement can be measured only in a single plane orthogonal on the wafer plane. A decisive disadvantage of the arrangement according to the U.S. Pat. No. 4,772,928 resides in the aspect that the variation of the distance between the gate and the channel zone is proportional to the product of tongue length and the sine of the tongue deflection angle. (This corresponds to a circular movement in theory). The resulting control effect is therefore small. In an approach to permit an analysis, the difference between the currents of two field effect transistors, whose channel zone is respectively located on the underside or on the upper side of the wafer, is measured. The U.S. Pat. No. 5,541,437 discloses an appropriate arrangement and the suitable technology that permit the detection of movements in the wafer plane. According to the U.S. Pat. No. 5,903,038, a vertical transistor structure, too, in parallel with the laterally disposed transistor, is used for the detection of a mechanical movement.

What is inexpedient in these solutions so far available is the aspect that the mobile structures are manufactured by means of additional layers or wafers, which leads not only to a high complexity and higher costs but also to mechanical strain in these layers or wafer compounds, respectively. In particular, in the solution known from the U.S. Pat. No. 5,903,038, which comprises a vertical FET element, the distance of the movable gate from the channel zone is determined by the thickness of a sacrificial layer that is usually etched by means of wet chemical solutions. This, in turn, determines the thickness of the sacrificial layer because the etching solution can no longer reliably penetrate into very narrow gaps. Apart therefrom, in the sacrificial layer technique, the movable electrode consists of a thin-layer material presenting a mechanical reliability (tension in the layer, fracture strength and fatigue strength) that is worse than in the case of mono-crystalline silicon.

The use of conventional lateral MOS transistors with movable gate, which consist of mono-crystalline silicon of a silicon wafer, has so far been restricted to the detection of vertical movements.

Another method ("direct integration technology") on the basis of a mono-crystalline silicon wafer makes use of the modulation of the energy gap in the silicon crystal. The mechanical movement is detected via a torsion arm of mono-crystalline silicon, which is anchored on one end. At the clamping site of the torsion arm, this induces then a "stress effect" on the crystal lattice, which results in a shift of the energy bands in the crystal. The detection of band bending is realised by an analysis of the current flowing through a pn diode or a MOSFET element, which can be generated in the clamping region of the torsion arm by means of appropriate doping.

Difficulties in the "direct integration technology" are present in the region of the arm-clamping site. Neither the reproducibility of the technologic definition of the clamping point, which is referred to as so-called overlay or as coverage precision, nor the long-term stability of the transistor parameters is ensured.

Micro-mechanical structures permitting the detection of a mechanical movement, should present a sufficient mechanical stability, should be applicable to all three directions in space, should be inexpensive and suitable for manufacture in a manner compatible with microelectronics, and should moreover be based on a reliable and versatile detection method for many applications. Even though the existing engineering solutions often satisfy one part of these requirements a suitable structure with the associated manufacturing process, which satisfies all the aforementioned demands, has so far not existed. Technologies such as the sacrificial layer technology, where the functional elements consist of deposited or epitaxially grown layers, result, on principle, in higher mechanical strain or in an impaired mechanical stability, compared against mono-crystalline silicon.

Solved Problem

The present invention is based on the problem of proposing a vertical field effect transistor with a movable gate, as well as a method of producing this transistor, where the disadvantages resulting from prior art will be avoided and which are expedient or simple in application.

Description

In accordance with the present invention, the problem is solved by the claimed invention which includes a method of manufacturing the array.

The preferred embodiments are the subject matters of the dependent Claims.

The inventive concept resides in the aspect that the detection of a mechanical movement and the signal conversion into an electrical quantity are realised by means of a vertical field effect transistor including a movable gate electrode. The field effect transistor consists here of a residual transistor structure including a source, drain and bulk zone and a movable gate structure. Both structures are manufactured from a single semiconductor wafer that consists preferably of mono-crystalline silicon. In this manner, the essential demands on the material of such a system are satisfied in an excellent manner. The semiconductor wafer may generally also encompass layers applied already for the definition of the residual transistor. The residual transistor generally consists of vertical regions, e.g. the differently doped strata of the semiconductor wafer. The movable structures are defined in the wafer close to the surface from the face side. The movable gate structure is located, for example, within a trough located in the semiconductor wafer and intersecting the vertical transistor. The channel zone is formed in the bulk zone of the transistor whilst the movable gate structure is assigned the function of the gate electrode. The suspension of the movable gate structure is preferably realised by means of resilient and/or torsion arms in such a way that variations of the distance between the movable gate structure and the channel zone will become possible. The gate structure is created by anisotropic and isotropic etching processes in the wafer. The width of the gap between the movable gate structure and the residual transistor is defined by the etching process. Passivation of the channel zone is achieved preferably by means of an oxide layer on the sidewall of the trench trough on which the channel zone is located. The gate structure is movable in the wafer plane for the detection of movements in the wafer plane whilst it is suspended for mobility in a direction orthogonal on the wafer plane for the detection of movements normal on the wafer plane.

There is no direct fixed mechanical connection between the gate structure and the channel zone of the transistor in the bulk zone. Coupling between the gate electrode and the channel zone is provided through an air or vacuum gap as the dominating dielectric.

The distance of the gate electrode as determining quantity may possibly be preset by means of an electrostatic driving comb. In that embodiment, the movable gate may be very closely approached to the residual transistor structure (prepositioned) by an additional constant force in order to be able to improve the signal variation in response to the action of the forces to be determined.

The micro-mechanical vertical field effect transistor is composed of a movable gate electrode that consists preferably a mono-crystalline silicon and of an opposite region of vertically stacked, differently doped zones as residual transistor (source, drain and bulk zone). The movable gate electrode is sensitive to the mechanical forces that present a force component in a preferred direction. Preferred directions may extend in the wafer plane but may also be oriented orthogonally on the wafer plane. This results in a variation of the distance or the position of the gate electrode relative to the residual transistor, which induces a change of the impedance of the inversion channel, which is due to a variation of the electric field. In the case of the preferred embodiment of the inventive vertical field effect transistor with a gate structure mobile in the wafer plane, this gate structure directly approaches the channel zone or directly moves away from the channel zone. As a consequence, the variation of the distance from the channel corresponds to the movement directly. This results in an optimum modulation of the channel conductance and in a high local resolution of the gate position. When the invention is embodied in a form including a gate structure mobile in a direction orthogonal on the wafer plane, e.g. in the form of a tongue positioned in front of the residual transistor, this advantage does not become apparent. The variation of the distance of the gate structure from the bulk zone corresponds here to the sine of the angle of deflection of the tongue from the wafer plane, multiplied by the length of the tongue. However, this embodiment presents substantial advantages over prior art because the configuration of such a mobile gate with a vertical transistor avoids the problems which the prior art systems involve in terms of manufacturing technology.

The inversion channel of the transistor is formed between the drain and source terminal zones. The drain and source terminal zone with the intermediate channel zone are created by different doping types. In distinction from a conventional field effect transistor, the inversion channel in the vertical field effect transistor with a movable gate electrode is controlled by the distance of the gate structure and hence the distance of the gate electrode from the channel zone, rather than by the voltage applied on the gate terminal. The movement of the micro-mechanical sensor structure is converted, in the last analysis, into an equivalent current flow in the inversion channel.

This method permits the evaluation of mechanical movements within the wafer plane and mainly also the direct conversion of a mechanical movement into transistor parameters. In order to permit the measurement of movements or accelerations in all three directions in space it is possible to dispose several inventive field effect transistors on a semiconductor wafer, for example. The preferred directions of the movements of the individual gate structures, which are determined by the type of suspension, present components orthogonal with respect to each other. Hence, at least two inventive transistors in such an arrangement must be present in order to record all the movements in the wafer plane. At least one further element is required for measuring the movements normal on the wafer plane.

The different doping zones of the vertical transistor are preferably produced as early as before the surface is structured. The surface structuring step comprises the definition of the mobile gate structure and its suspension. CMOS-compatible doping, coating and etching technologies permit the manufacture of the desired doping profiles as well as the subsequent galvanic isolation of the different functional elements. In these cases, a potential isolation can be realised by means of blocked pn-junctions, as is disclosed, for instance, in the U.S. Pat. No. 4,772,928, or by the application of other isolation techniques such as those described in the U.S. Pat. No. 5,930,595. According to another example, the isolation may be made on the basis of SOI (silicon on insulator) wafers. To this end, the functional elements to be galvanically isolated are isolated from each other by means of trench troughs reaching down to the insulator layer of the SOI wafer. The trench troughs may also be filled again, possibly partly, with insulating materials. In a conventional silicon wafer, too, which is provided with the vertical doping zones by doping processes, it is possible to produce the desired functional elements that consist all preferably of mono-crystalline silicon. To this end, methods of self-adjusting exposure (etching out) of the movable structures can be employed.

The "micro-mechanical vertical FET element" may be produced with application of individual processes of doping and exposure of structures in the vicinity of the surface of a mono-crystalline wafer or even an SOI wafer compound, which are known per se. The application of methods compatible with micro technology is equally possible on principle for the monolithic integration into a standard CMOS process.

The exposure of the micro-mechanical structures, i.e. the mobile components of the transistor in the vicinity of a wafer substrate, e.g. of silicon, is carried out with a process following the example of the disclosure of the document WO 91/03074. In the simplest case, this process only requires one additional lithographic step. Moreover, it permits the production of structures presenting a high aspect ratio. The term "aspect ratio" is meant to denote the ratio of height to width of a structure. On account of the high aspect ratio of the suspensions, e.g. the resilient bars, the mobility of the gate structure in the preferred direction in the wafer plane or in a direction orthogonal thereon is determined. With a preferred direction of movement in the wafer plane, the suspensions, e.g. the resilient bars, are substantially higher than broad (high aspect ratio in the z-direction, i.e. in a direction normal on the wafer plane). With this provision, a high rigidity is achieved for movements orthogonal on the wafer plane.

The inventive vertical field effect transistor with a mobile gate, which consists preferably of mono-crystalline silicon, achieves the following further advantages:

The mobile structure, too, consist of a mono-crystalline silicon material that is excellent and appropriate from a mechanical point of view, in the preferred case of the same wafer as the residual transistor (source, drain and channel zone);

small space requirement, compared against the principle of capacitive analysis

There are principally no positional errors between the mobile gate and the stationary residual transistor structure because only one mask is used to define the position.

It is possible to couple various sensor structures with the degree of freedom of movement within the wafer plane. As a result, two directions in space can be detected.

Due to a suitable layout (laterally rigidified, vertically mobile structures) of the structures with the movable gate, the third direction in space can be analysed as well on the same silicon wafer. The array capacity exists in general.

There is no mechanical coupling for the conversion of the mechanical quantity into the electrical quantity, such as the torsion bar in "direct integration technology".

Compared against the capacitive methods, the stray and line capacitance levels create only a slight influence on the conversion process.

The conductance of the gate electrode is created by doping the stack of strata. Therefore, an additional doping step is not required in order to create the gate conductance.

The shape and the mass of the mobile gate electrode and its suspension can be freely selected over a wide range; this opens up the most different sensor applications as a result.

The present invention will now be described in the following by embodiments, without any limitation of the general inventive idea, with reference to the drawings.

FIG. 1f illustrates a cross-sectional view taken through the inventive transistor from FIG. 2 along the sectional line A–B.

Figure 1:
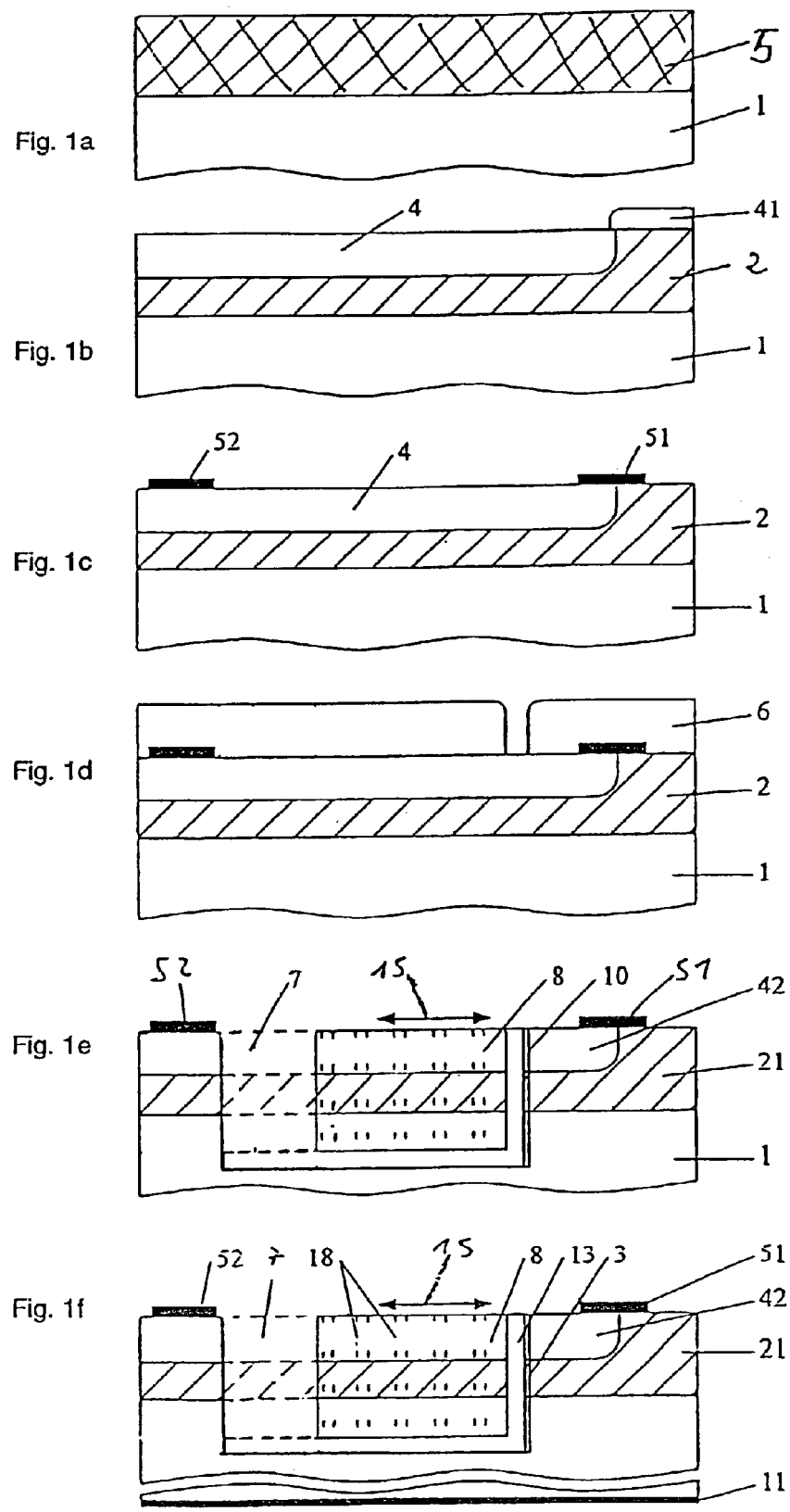
FIG. 1 shows the flow of the process in the method of manufacturing the inventive vertical field effect transistor in six production steps.

In accordance with FIG. 1, the inventive method for the production of the vertical transistor with a movable gate, which consists preferably of mono-crystalline silicon, starts out from a non-structured wafer substrate (1). Micro-electronic components already integrated may be present on the wafer as well.

Figure 2:
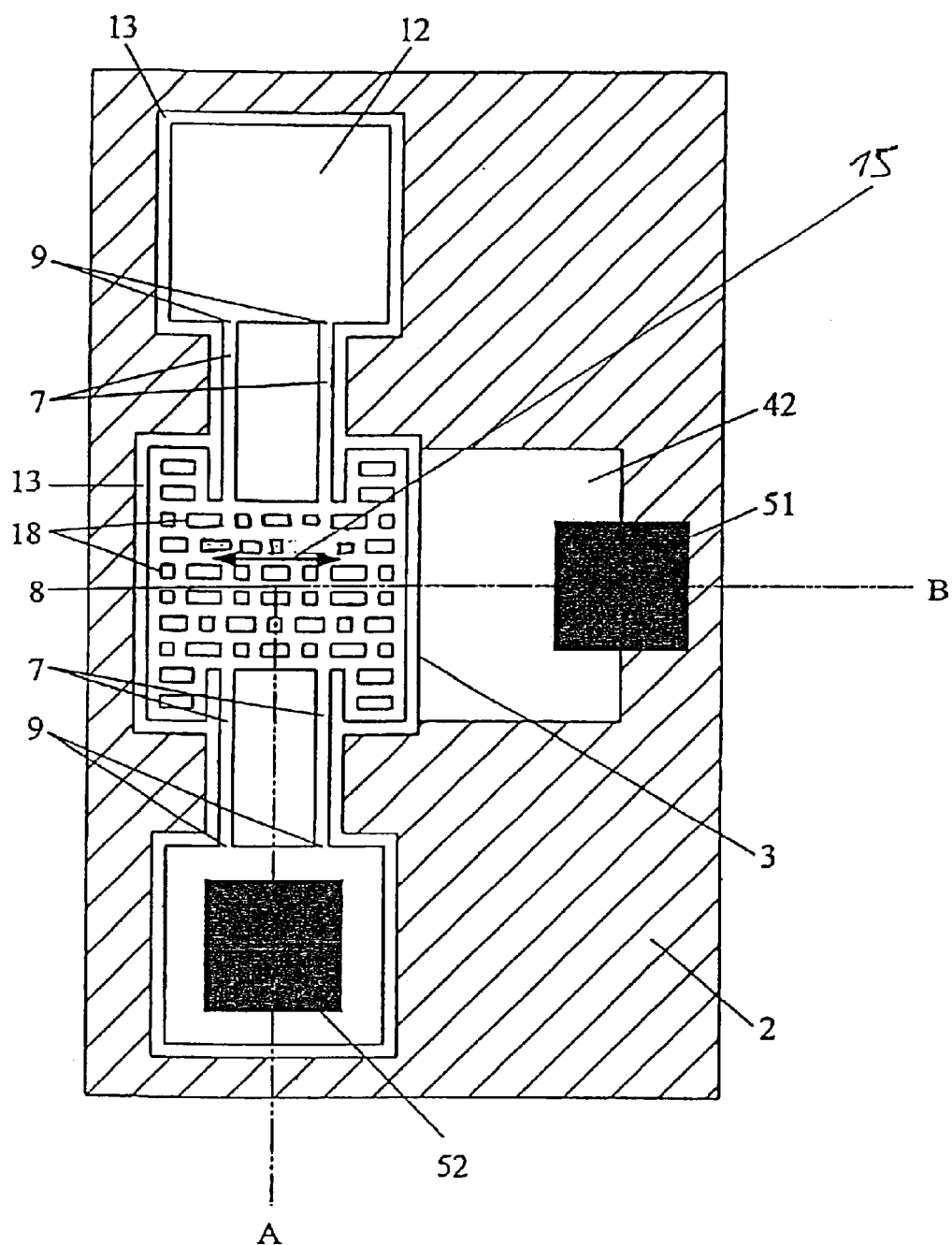
FIG. 2 is a plan view of a conceivable inventive array.

First of all, according to FIG. 1a, an n-doped silicon wafer (1) (doping density in the range of $10^{19} cm^{-3}$) is provided with an appropriate doping stack that forms, on the one hand, the residual transistor and, on the other hand, the movable gate electrode, later on. The conductance of the gate electrode can be determined in this step as well. In the present example, first an epitaxial step is employed to grow an n-doped layer (5) of low doping level (e.g. $10^{10}$ phosphorous ions/cm$^2$) is grown, which presents a thickness of 2 μm, for example. This layer is necessary as a p-doped layer should not be epitaxially grown on the n-doped silicon wafer due to the conditions of manufacture. The subsequent production of a p-doped layer (2) in the n-doped layer (5) by means of boron implantation (e.g. $10^{12}$ boron ions/cm$^2$ at an ionic energy of 200 keV) determines, inter alia, also the doping of the subsequent channel zone (3) in the bulk zone (21). The n-doped layer (5) is hence converted by ion implantation into a p-doped layer (2). In correspondence with FIG. 1b, the upper n-conductive layer (4) is created by a further ion implantation step (e.g. $10^{15}$ arsenic ions/cm$^2$ at an ionic energy of 150 keV), which defines, inter alia, the subsequent source zone (42). In the preferred embodiment, this is performed through a structured adhesive resist substance (41). The aforementioned mask is produced by means of photolithographic processes and removed again after the implantation process by a resist-removal operation. The donors are activated and the desired doping profiles are set by means of various tempering steps. According to an alternative manufacturing process, the doping and epitaxy steps take place in the course of the process of manufacturing micro-electronic components. According to FIG. 1c, the step of depositing a layer, e.g. of aluminium, and its structuring furnishes the bond pads (51, 52) for the connection (51) of the subsequent source zone (42) in parallel with the remaining p-doped epitaxial layer (2), the subsequent bulk layer of the transistor (21), as well as for gate contacting (52). In the following photolithographic step according to FIG. 1d, first the image of all mobile and stationary structures in the mono-crystalline silicon is transferred into the wafer surface by means of a photoresist (6). Then follow common anisotropic and isotropic etching processes in combination with the deposition of a passivation layer (10) that ensures the protection of the channel surface on the mobile structures later on. AI the mobile structures can be exposed in one process run at the same time. The deposition of the passivation layer is preferably carried out by means of a plasma CVD process (chemical vapour deposition, CVD). It is also possible, however, to employ another CVD process or an oxidation process for deposition. Components of a sufficiently narrow design such as resilient bars (7) or structures with a perforation (18) formed therein, according to FIG. 1e and the plan view in FIG. 2, are detached, in the last analysis, from the substrate by isotropic under-etching. The perforations (18) are expedient here for better under-etching. The mobile structures are fastened on the fastening points (9) mostly via at least one resilient bar (7) in order to achieve the desired mobility. The direction of movement (15) of the gate structure is illustrated in the Figure by means of an arrow. A resilient bar is illustrated in the Figure in dashed lines. The resilient bar is offset to the rear side, relative to the sectional line A–B. It presents the same succession of doped layers as the mobile gate structure. The deposition of a metal layer (11) on the rear side of the wafer then permits contacting of the drain zone according to FIG. 1f. As is shown there in a schematic view, the converter structure so produced can be used in the manner explained below. A positive voltage is applied to the n-doped drain zone (11) adapted to be contacted on the rear side of the wafer, opposite to the source terminal (51). The consequence of this is the fact that current cannot flow through the lower pn-junction that is polarised in a reverse sense. The source zone (42) with the other zones disposed therebelow, however, is isolated from the movable gate by a trench trough (13) that presents a depth of 5 μm, for example. When the movable structure, which acts as gate (8) and on which a positive voltage is applied relative to the source, is approached it is possible that electrons from the p-doped bulk area located between the source zone and the drain zone can arrive in the vicinity of the side wall to an increasing extent. The inversion channel (3) so crated then permits the flow of a current between the source and drain zones, which current is modulated by the distance between the movable gate structure and the channel zone.

According to an alternative embodiment of the inventive transistor, a p-substrate with a low doping level is used in order to achieve a better potential isolation between the drain terminal and the gate terminal. In this case, the drain zone is provided on the front side, i.e. on that side of the waver substrate on which the movable gate and its suspension are structured. Moreover, the source zone is connected here from the front side of the transistor.

FIG. 2 illustrates a plan view of the inventive field effect transistor with a movable gate. The illustration also shows the lateral structuring of the doping zones for a definition of the residual transistor. The movable gate structure (8) and its suspension are isolated by trench troughs (13) from the remaining part of the transistor. The gate structure is anchored on fastening structures (12) by means of resilient bars (7) in such a way that the gate structure will be mobile in the wafer plane and that the distance between the gate structure and the channel zone located underneath the source zone (42) is varied by the acceleration forces to be measured. The movable gate can be contacted via a bond pad (52) on one of the fastening structures. Another bond pad (51) is applied for contacting the source zone on the boundary between the source zone embedded into the doped area of the bulk zone (2) and the bulk zone. The positioning of the pad on the boundary permits the connection of the source and bulk zones on a pad. Moreover, the perforations (18) in the gate structure can be recognised.

Figure 3:
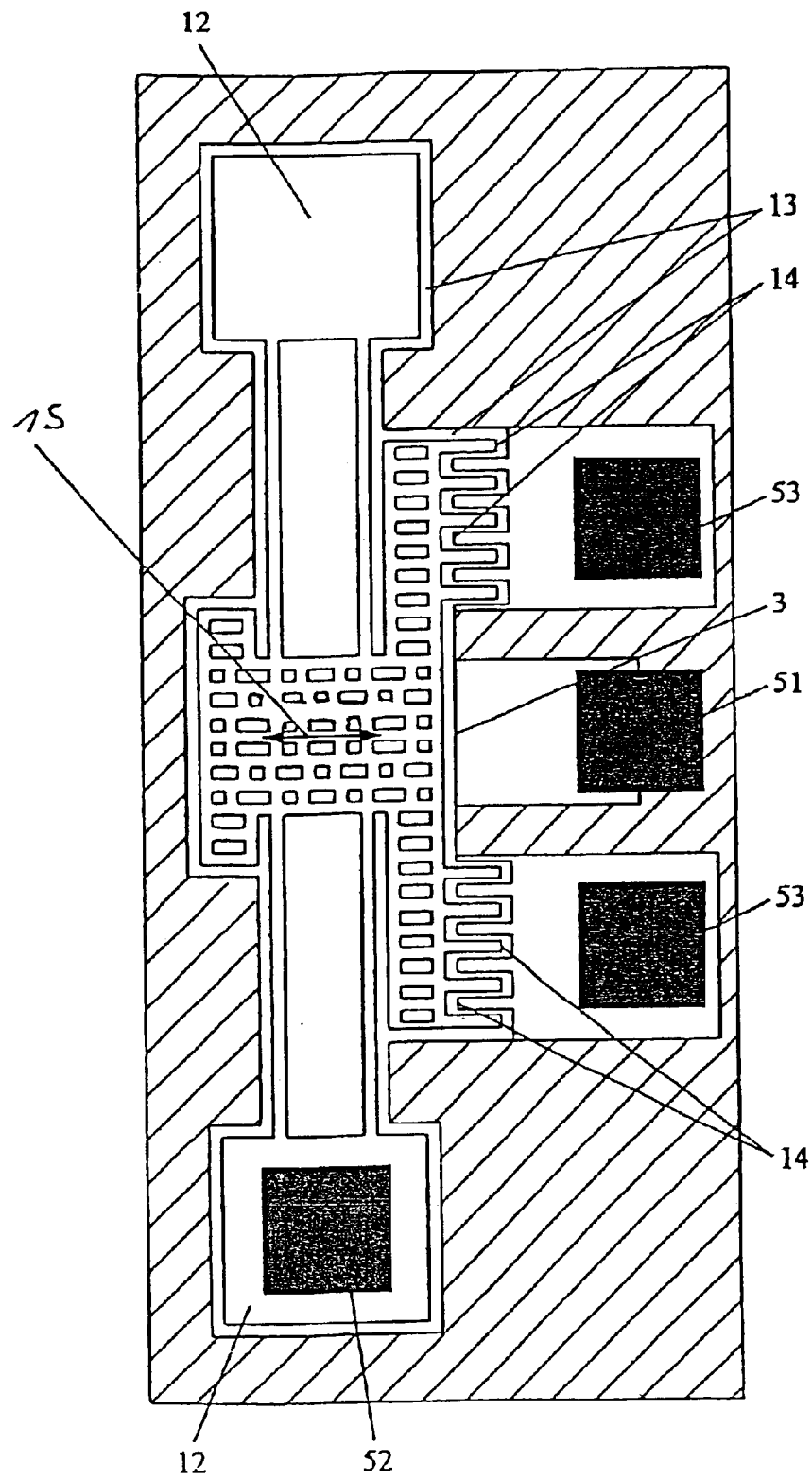
FIG. 3 illustrates the plan view of a conceivable inventive array in which the distance between the movable gate and the bulk- zone can be adjusted by means of electrostatic driving combs.

FIG. 3 shows the inventive field effect transistor with a movable gate according to an embodiment wherein the distance between the movable gate and the bulk zone can be adjusted by means of electrostatic driving combs (14). A voltage relative to the movable gate structure can be applied to the driving combs via the associated contact pads (53). As a result, the basic distance between the gate structure and the bulk zone can be varied, e.g. reduced. In the case of a reduction, the sensitivity of an acceleration sensor implemented with the inventive vertical field effect transistor is increased. As the distance can be adjusted an adaptation to the demands involved in various applications becomes possible. Moreover, there is the opportunity to operate the array in a feedback loop (closed loop). To this end, the deflection of the movable gate in the event of acceleration is opposed in a controlled manner by appropriately controlling the driving combs. Hence, the deflection of the gate structure is reset.

List of Reference Numerals 1 n-doped substrate (also drain zone)
2 p-doped layer
3 channel zone
4 n-doped layer
5 (epitaxial) layer with a low n-dope level
6 photoresist layer for surface structuring 7 resilient bar
8 gate structure
9 fastening points
10 passivation layer
11 metal layer
12 fastening structures
13 trench trough
14 electric driving combs
15 direction of movement of the gate structure
18 perforation
21 bulk zone
41 adhesive photoresist mask for definition of the n-layer of the source zone
42 source zone
51 bond pad for the source zone
52 bond pad for gate contacting
53 bond pad for driving combs

What is claimed is:

1. Vertical field effect transistor produced from a semiconductor wafer, comprising a residual transistor including
   a source zone,
   a channel zone,
   a drain zone; and
   a movable gate structure disposed by means of at least one flexible suspension in front of and spaced from said channel zone, wherein said movable gate structure is of a material of said semiconductor wafer, and wherein said residual transistor and said movable gate structure are manufactured from a single semiconductor wafer.

2. Vertical field effect transistor according to claim 1, wherein said residual transistor further includes vertically stratified differently doped zones.

3. Vertical field effect transistor according to claim 1, wherein said gate structure is disposed, at least partly, within the wafer and/or presents vertical perforations; and wherein walls of said channel zone are covered, at least partly, with a dielectric layer.

4. Vertical field effect transistor according to claim 1, wherein said at least one flexible suspension is constructed and arranged such that the gate structure is movable in a plane of the wafer so that variation in distance is possible between the gate structure and said channel zone.

5. Vertical field effect transistor according to claim 4, wherein said at least one flexible suspension provides a high aspect ratio in a z-direction.

6. Vertical field effect transistor according to claim 1, 2, 3, 4 or 5, further comprising a device for pre-setting distance between said gate structure and said channel zone.

* * * * *